United States Patent
Cheng et al.

(10) Patent No.: US 7,696,766 B2
(45) Date of Patent: Apr. 13, 2010

(54) ULTRA-FINE PITCH PROBE CARD STRUCTURE

(75) Inventors: Hsu Ming Cheng, Hsin-Chu (TW); Clinton Chao, Hsinchu (TW); Fa-Yuan Chang, Taipei (TW); Hua-Shu Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 286 days.

(21) Appl. No.: 11/731,938

(22) Filed: Apr. 2, 2007

(65) Prior Publication Data

US 2008/0180123 A1 Jul. 31, 2008

Related U.S. Application Data

(60) Provisional application No. 60/898,461, filed on Jan. 31, 2007.

(51) Int. Cl.
*G01R 31/02* (2006.01)
(52) U.S. Cl. ........................................ 324/754
(58) Field of Classification Search ................ None
See application file for complete search history.

(56) References Cited

U.S. PATENT DOCUMENTS

| | | | |
|---|---|---|---|
| 5,177,439 A | 1/1993 | Liu et al. | |
| 5,476,211 A | 12/1995 | Khandros | |
| 5,974,662 A | 11/1999 | Eldridge et al. | |
| 6,238,938 B1 | 5/2001 | Smith | |
| 6,292,003 B1 | 9/2001 | Fredrickson et al. | |
| 6,586,955 B2 | 7/2003 | Fjelstad et al. | |
| 6,661,244 B2 | 12/2003 | McQuade et al. | |
| 6,676,438 B2 | 1/2004 | Zhou et al. | |
| 6,815,961 B2 | 11/2004 | Mok et al. | |
| 6,906,540 B2 | 6/2005 | McQuade et al. | |
| 6,917,102 B2 | 7/2005 | Zhou et al. | |
| 7,049,837 B2 | 5/2006 | Kasukabe et al. | |
| 7,071,715 B2 * | 7/2006 | Shinde et al. | 324/754 |
| 7,129,730 B2 | 10/2006 | Liu et al. | |
| 7,145,354 B2 | 12/2006 | Stillman | |
| 2003/0057976 A1 | 3/2003 | Deguchi | |
| 2006/0125498 A1 | 6/2006 | Liu et al. | |
| 2007/0152689 A1 | 7/2007 | Lee et al. | |
| 2007/0222465 A1 | 9/2007 | Huang et al. | |
| 2008/0048685 A1 | 2/2008 | Chui et al. | |
| 2008/0116923 A1 * | 5/2008 | Cheng et al. | 324/761 |
| 2009/0015275 A1 * | 1/2009 | Cheng | 324/754 |
| 2009/0223043 A1 * | 9/2009 | Hsu et al. | 29/830 |

\* cited by examiner

*Primary Examiner*—Jermele M Hollington
(74) *Attorney, Agent, or Firm*—Slater & Matsil, L.L.P.

(57) ABSTRACT

A system and a method of testing a semiconductor die is provided. An embodiment comprises a plurality of tips that each comprise a substrate with a conductive via, a first dielectric layer with vias connected to the conductive via, a second dielectric layer with vias over the first dielectric layer, and a metal layer over the second dielectric layer. Additional dielectric layers with vias may be used. This tip is electrically connected to a redistribution line that routes signals between the tip to electrical connections on a space transformation layer. The space transformation layer is electrically connected to a printed circuit board using, for example, a spring loaded connection such as a pogo pin. The space transformation layer is aligned onto the printed circuit board by a series of guidance mechanisms such as guide pins or smooth fixtures, and the planarity of the tips is adjusted by adjusting the screws.

28 Claims, 13 Drawing Sheets

ULTRA-FINE PITCH PROBE CARD STRUCTURE

This application claims the benefit of U.S. Provisional Application No. 60,898,461, filed on Jan. 31, 2007, entitled "Ultra-Fine Pitch Probe Card Structure," which application is hereby incorporated herein by reference.

TECHNICAL FIELD

The present invention relates generally to a system for testing semiconductor devices and, more particularly, to a system and method for forming a probe card with an ultra-fine pitch.

BACKGROUND

In the manufacturing of integrated circuits and other semiconductor devices, the circuits and devices must be tested in order to ensure that a functional device has been manufactured. These tests are usually performed by contacting a test probe card to the relevant areas of the semiconductor device, and performing one or more functional tests. Two main types of probe cards are currently used to make these connections.

FIG. 1 illustrates a plan view of one type of probe card 100 that is used to test a semiconductor device (not shown). This probe card uses a series of cantilever connectors 101 that radiate inward from the edges of the probe card 100. When the probe card 100 is lowered onto the semiconductor device to be tested, the cantilevered connectors 101 connect to corresponding contact pads on the semiconductor device to complete the electrical connections for the test. Unfortunately, this type of probe card 100 is limited due to the fact that the contact pads are limited to the peripheral of the semiconductor device to be tested, and it cannot reach contact pads located in the central areas of the devices.

FIG. 2 illustrates a cross section of a portion of another type of probe card 200 which uses a array of electrical connections 201 in order to connect to a semiconductor device (not shown) in areas other than the periphery. In this type of probe card 200, the electrical connections 201 are spaced closely together in an array, and are shaped so that the electrical connections 201 absorb some of the shock of the impact when the probe card 200 is lowered on to the semiconductor device to be tested. However, the minimum pitch (the distance between the electrical connections 201) for this type of card is limited by the structure and shape of the electrical connections 201 and the current finest pitch attainable with this type of probe card is about 175 µm.

Unfortunately, as the dimensions of semiconductor devices are reduced in the ever-present drive for smaller and smaller devices, these types of probe cards will be unable to adequately test semiconductor devices requiring a smaller probe pitch. Accordingly, a probe card with a smaller probe pitch is needed.

SUMMARY OF THE INVENTION

These and other problems are generally solved or circumvented, and technical advantages are generally achieved, by embodiments of the present invention which include a semiconductor device test structure.

In accordance with an embodiment of the present invention, a device for testing semiconductor devices comprises an array of tips, each tip comprising a substrate with a conductive via running through it, a first dielectric layer over the conductive via, a first set of vias located within the first dielectric layer and connected to the conductive via, a second dielectric layer over the first dielectric layer, a second set of vias located within the second dielectric layer, and a first metal layer located over the second set of vias. The device also comprises a plurality of redistribution lines connected to the plurality of conductive vias, and a first plurality of electrical connections, such as solder bumps, connected to the plurality of redistribution lines.

In accordance with another embodiment of the present invention, a device for testing semiconductor devices comprises an array of tips similar to the tips of the first embodiment that are connected to a space transformation layer. The space transformation layer fans out the pitch of the first plurality of electrical connections even further through a series of conductive and insulative layers. The space transformation layer is connected to a printed circuit board for the test.

In accordance with yet another embodiment of the present invention, a device for testing semiconductor devices comprises a printed circuit board, a space transformation layer, and a plurality of tips similar to the tips of the first embodiment described above. The printed circuit board and the space transformation layer are electrically connected through a first plurality of electrical connections. The space transformation layer and the plurality of tips are connected through a second plurality of electrical connections. The pitch of the tips is smaller than the pitch of the second plurality of electrical connections, and the pitch of the second plurality of electrical connections is smaller than the pitch of the first plurality of electrical connections. The tips are comprised of a plurality of dielectric layers that each have a set of vias formed inside of them. The vias in one dielectric layer are electrically connected to the vias in the adjacent dielectric layers, and a metal layer is located over the dielectric layer located furthest from the substrate.

An advantage of embodiments of the present invention is that a smaller contact pitch can be obtained. This allows for the testing of smaller structures.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a probe card. The invention may also be applied, however, to other non-permanent electrical connections.

Figure 1:
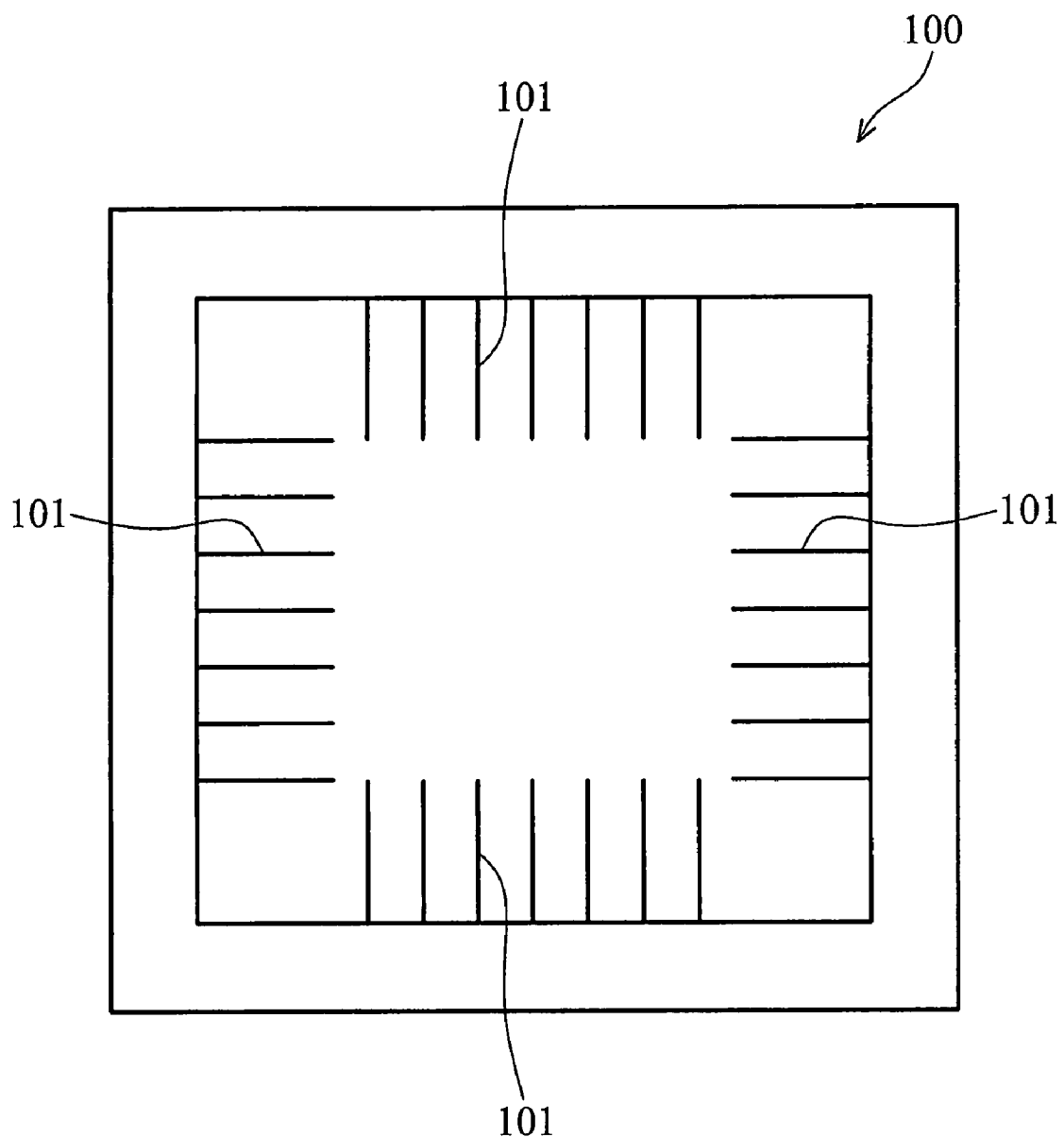
FIG. 1 illustrates a cantilever pitch card in the prior art.
Figure 2:
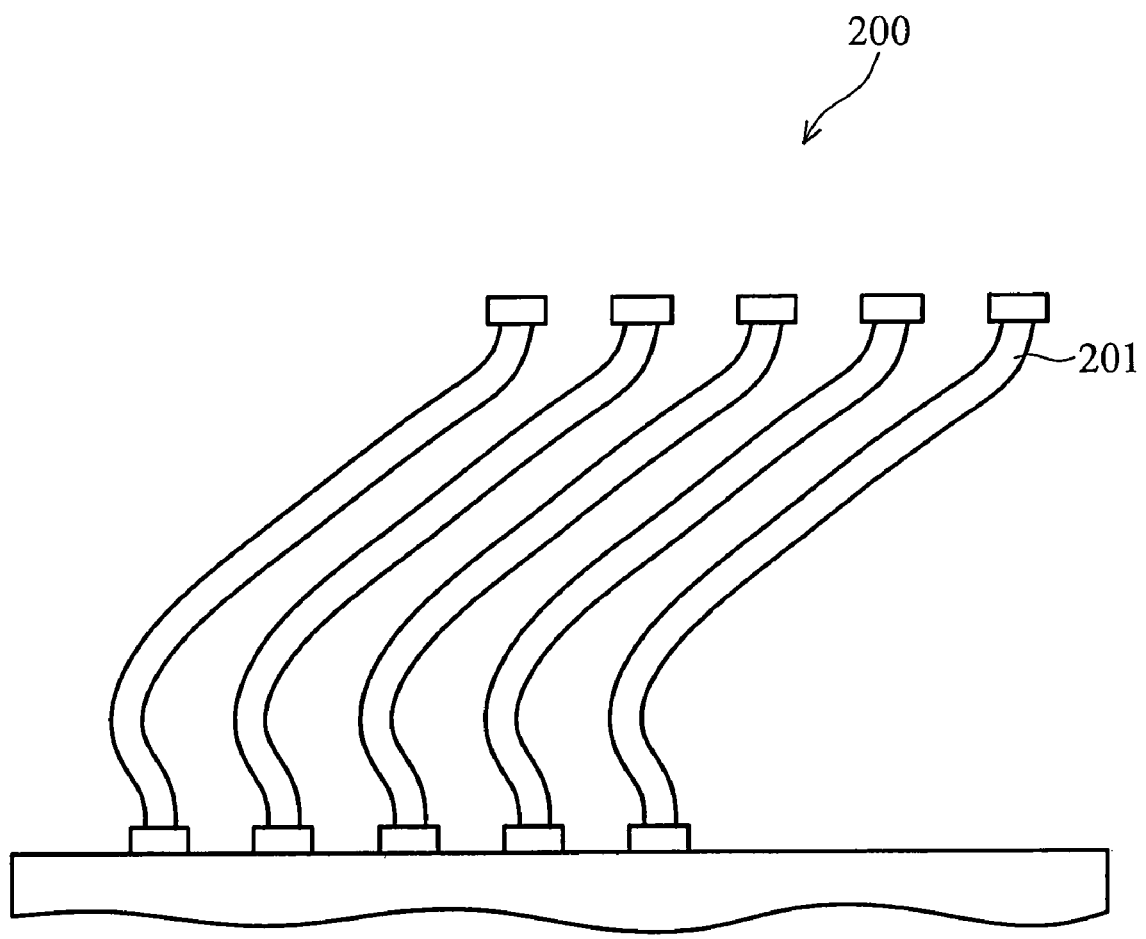
FIG. 2 illustrates a portion of an array type probe card in the prior art.
Figure 3:
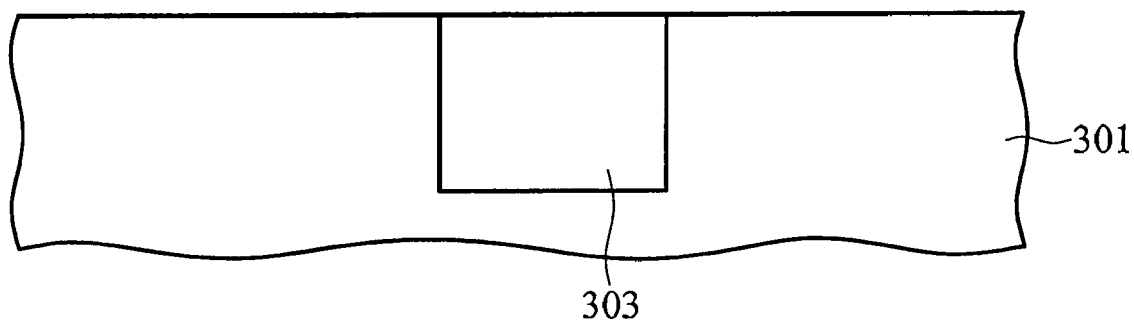
FIGS. 3-13 illustrate a method of forming a probe card tip in accordance with an embodiment of the present invention.

With reference now to FIG. 3, there is shown a substrate 301 with a via 303 of conductive material formed within the substrate 301. The substrate 301 comprises a semiconductor material such as silicon, germanium, silicon germanium, or combinations thereof. The substrate 301 is initially between about 400 μm to about 725 μm, with a preferred thickness of about 500 μm.

The via 303 may be formed, for example, through a damascene process, whereby a mask (not shown) is placed on the substrate 301, a recess is etched into the substrate 301, and the recess is overfilled with a conductive material. The overfilled via 303 is then planarized such that the via 303 is substantially planar with the surrounding substrate 301. In an embodiment, the conductive material is copper that has been deposited using an electroplating process, and the via 303 has a depth of between about 50 μm to about 725 μm, with a preferred depth of about 150 μm. It should be noted that the via 303 may comprise one or more layers of conductive material. For example, the via 303 may include barrier layers, adhesive layers, multiple conductive layers, or the like.

Optionally, a layer of an alloy 1302 (shown in FIG. 13) may be formed over the substrate 301 and the via 303, in order to provide a better connection to subsequent conductive vias (discussed below). This alloy 1302 would preferably be an alloy of aluminum and copper, and would be formed through a suitable process such as electroplating. However, other materials and processes could be used to form the alloy 1302. The alloy 1302 would have a thickness of between about 0.1 μm and about 3 μm, with a preferred thickness of about 0.4 μm.

Figure 4:
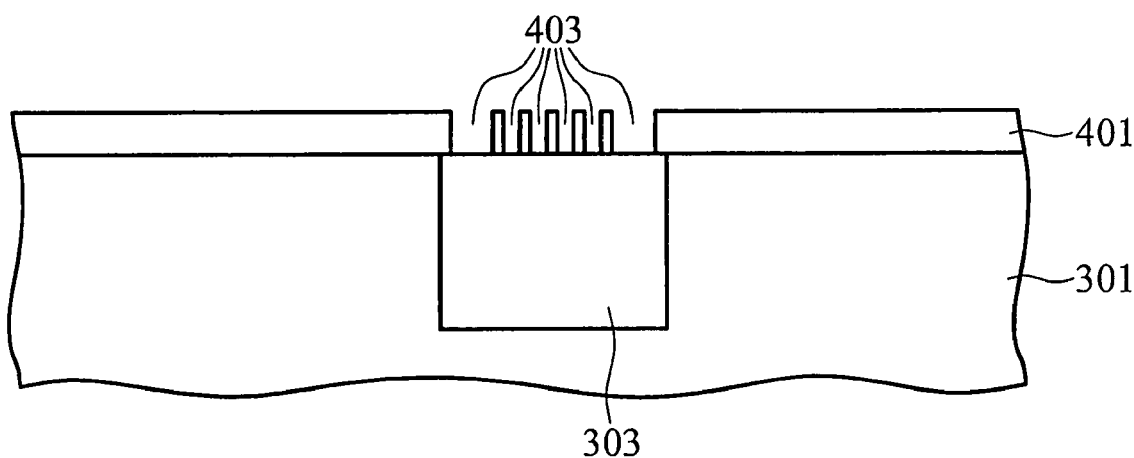

FIG. 4 illustrates a first dielectric layer 401 that has been deposited over the substrate 301 and the via 303. The first dielectric layer 401 is preferably an oxide layer that has a thickness of between about 0.2 μm and about 2 μm. The first dielectric layer 401 may be formed by plasma enhanced chemical vapor deposition (PECVD) techniques using tetraethyl-ortho-silicate (TEOS) and oxygen as a precursor. Other processes and materials known in the art may be used. Other materials, such as silicon oxide, nitrogen-containing oxide, aluminum oxide, lanthanum oxide, hafnium oxide, zirconium oxide, hafnium oxynitride, combinations thereof, or the like, may also be used.

The first dielectric layer 401 is then preferably masked and etched to form a first set of vias 403 to the underlying via 303. Preferably, there should be between about 6 to about 20 vias formed within the first dielectric layer 401, with a preferred number of six vias. The first set of vias 403 extends all of the way through the first dielectric layer 401 to substantially expose portions of the via 303. The first set of vias 403 have a diameter of between about 0.2 μm to about 5 μm, with a preferred diameter of about 0.5 μm.

Figure 5:
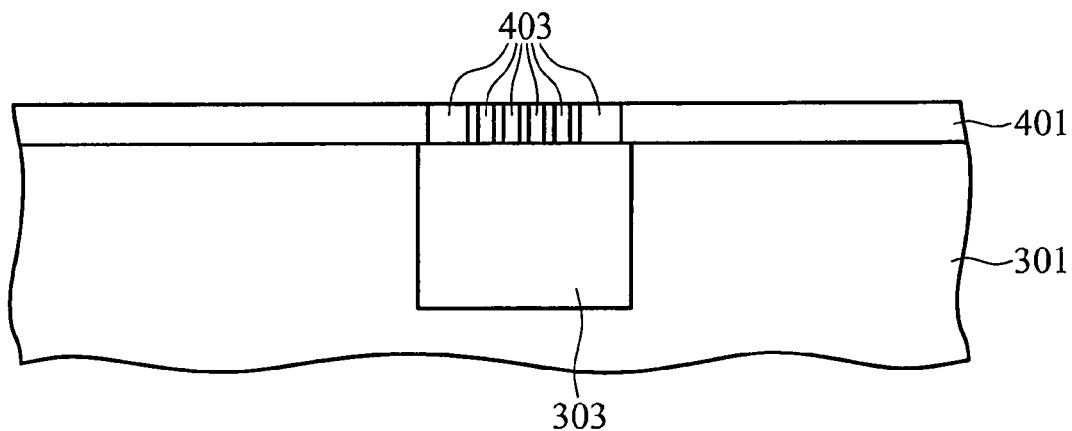

FIG. 5 illustrates the filling of the first set of vias 403. The first set of vias 403 is preferably formed by initially depositing a titanium nitride barrier layer (not shown) and then overfilling the first set of vias 403 with a conductive material, such as tungsten. Once overfilled, the first set of vias 403 is planarized by, for example, a CMP process. However, other methods and conductive materials known in the art could alternatively be used to form the first set of vias 403.

Optionally, a layer of an second alloy 1304 (shown in FIG. 13) could be formed over the first dielectric layer 401 and first set of vias 403, in order to provide a better electrical connection to subsequent vias (discussed below). This second alloy 1304 would similarly be an alloy of aluminum and copper, and would be formed through a suitable process such as electroplating. However, other materials and processes could alternatively be used in the formation of this alloy 1304. The second alloy 1304 would have a thickness of between about 0.1 μm and about 3 μm, with a preferred thickness of about 0.4 μm.

Figure 6:
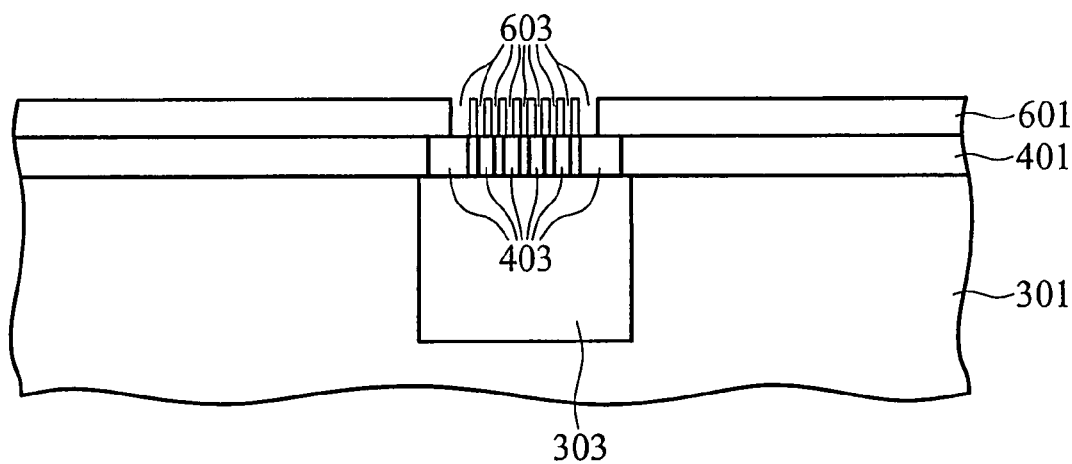

FIG. 6 illustrates the formation and patterning of a second dielectric layer 601. The second dielectric layer 601 may be formed of similar materials and in a similar fashion as the formation of the first dielectric layer 401 as discussed with reference to FIG. 4 above. Similarly, a second set of vias 603 may be formed in the second dielectric layer 601, substantially exposing portions of the first set of vias 403 in a manner similar to that discussed above with reference to the first set of vias 403.

However, there should be a larger number of vias in the second set of vias 603 as compared to the first set of vias 403, and the second set of vias 603 preferably have a smaller diameter than the first set of vias 403. Accordingly, in an embodiment, there should be nine vias with a diameter of between about 0.2 μm and about 5 μm, with a preferred diameter of about 0.5 μm. However, depending upon the circumstances, there could be more or less than nine vias, and the vias could have larger or smaller diameters.

Figure 7:
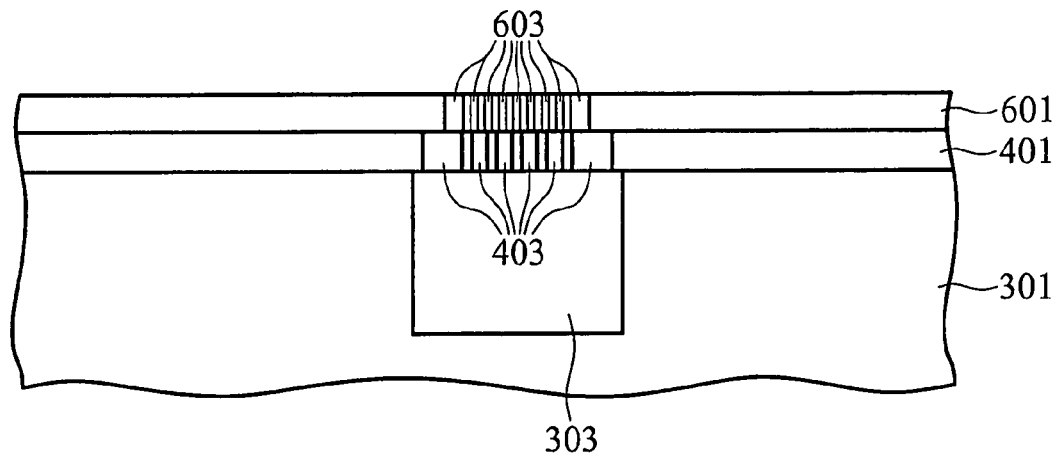

FIG. 7 illustrates the filling of the second set of vias 603. The second set of vias 603 are preferably filled similar to the first set of vias 403, i.e. a titanium nitride barrier is initially formed and then the second set of vias 603 is overfilled with tungsten. The second set of vias 603 is then preferably planarized through a CMP process to make the second set of vias 603 substantially planar with the second dielectric layer 601. However, other methods and conductive materials may be used to form the second set of vias 603.

Figure 8:
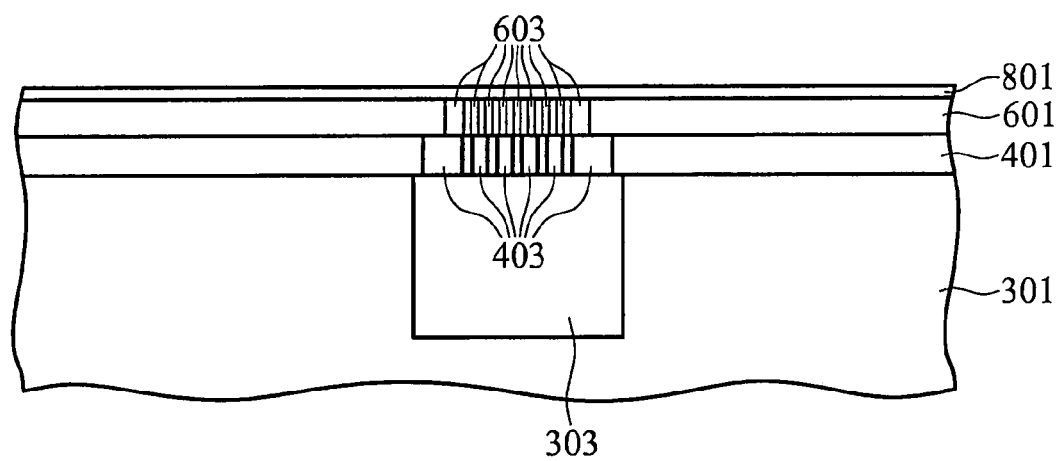

FIG. 8 illustrates the formation of a metal layer 801 over the second dielectric layer 601 and the second set of vias 603. The metal layer 801 is preferably formed of a hard metal that is also a good conductor, such as tungsten or rhodium, and is preferably formed through a CVD process to a thickness of between about 0.1 μm to about 5 μm, with a preferred thickness of about 1 μm. However, other processes and materials could alternatively be used to form the metal layer 801.

Figure 9:
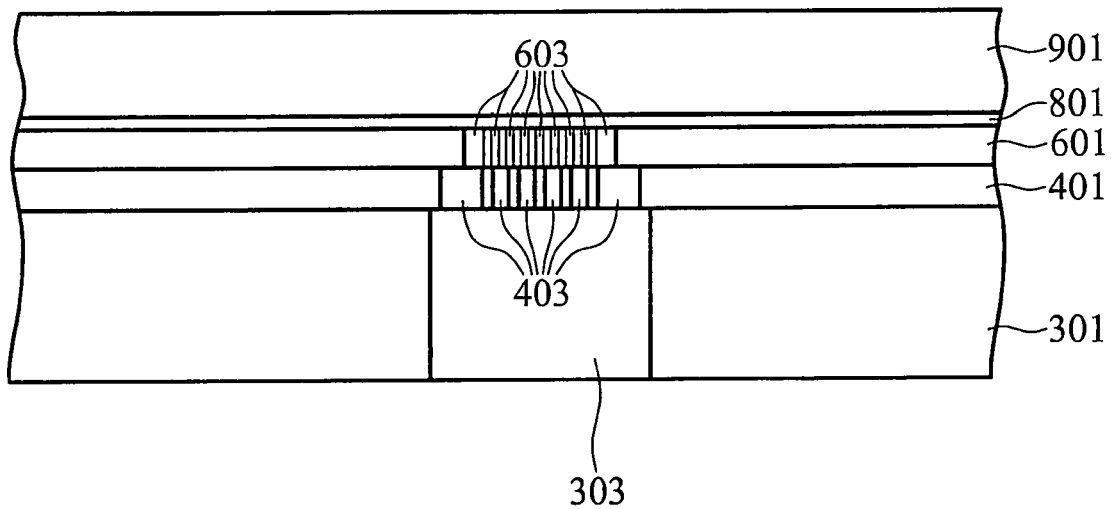

FIG. 9 illustrates the structure after a portion of the substrate 301 has been removed to substantially expose the via 303. To remove this portion a first carrier wafer 901 is attached to the metal layer 801 to help with movement and placement of the structure, as well as to protect the layers during processing. After the first carrier wafer 901 has been attached, a CMP is performed to substantially expose the via 303. However, other methods of removal could alternatively be used.

Figure 10:
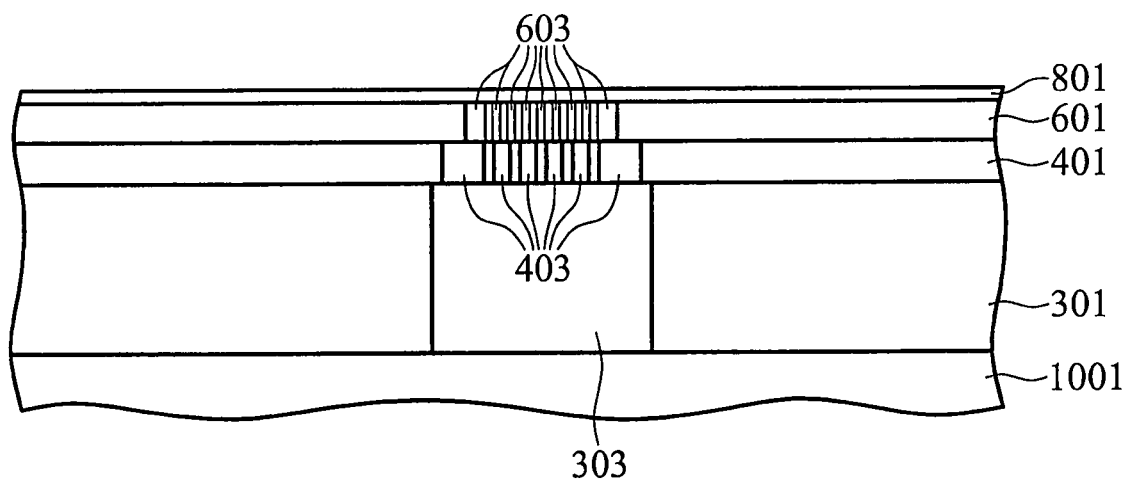

FIG. 10 illustrates the structure after a second carrier wafer 1001 has been placed to cover the substrate 301 and the exposed via 303. The first carrier wafer 901 (FIG. 9) is removed, and optionally, the metal layer 801 is cleaned to remove any residue from the first carrier wafer 801.

Figure 11:
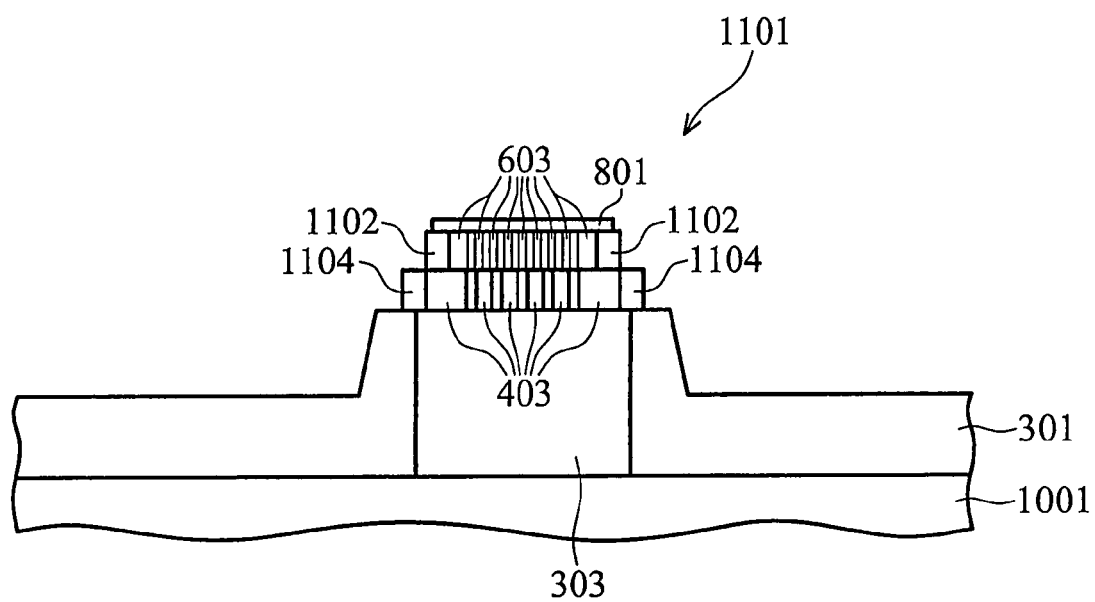

FIG. 11 illustrates the structure after portions of each layer have been removed, thereby forming a contact tip 1101. The contact tip 1101 is preferably formed through a series of masks and etches. For example, a first mask (not shown) is placed over the metal layer 801 using photolithographic techniques. The metal layer 801 is then selectively etched to remove the metal layer 801, except for a portion of the metal layer 801 over the second set of vias 603 and the second dielectric layer 601. The etching is preferably performed using dry etching. The first mask is then removed.

A second mask (not shown) is placed over the second dielectric layer 601 and the remaining portion of the metal layer 801 and patterned to protect the contact tip 1101. Once the mask is in place, the second dielectric layer 601 is selectively etched to remove exposed portions of the second dielectric layer 601. It should be noted that a first protective ring 1102 remains of the second dielectric layer 601, encircling the outermost of the second set of vias 603. This first protective ring 1102 of the second dielectric layer 601 has a width of between about 2 μm and about 10 μm, with a preferred width of 5 μm. The second dielectric layer is preferably etched using an etchant such as hexaflouropropene ($C_2HF_3$) or a perflourocarbon such as perfluoroeneopentane ($C_5F_{12}$). However, as one skilled in the art will recognize, many other etchants and processes could be utilized in order to remove the undesired portion of the second dielectric layer 601. The examples listed above are not meant to limit the present invention to those etchants. After the second dielectric layer 601 has been etched, the second mask is preferably removed.

A third mask (not shown) is formed over the metal layer 801, the second dielectric layer 601, and a portion of the first dielectric layer 401, and patterned to protect the contact tip 1101. Similar to the etch of the second dielectric layer 601, once the third mask is in place, the first dielectric layer 401 is selectively etched to remove exposed portions of the first dielectric layer 401. It should be noted that a second protective ring 1104 remains of the first dielectric layer 401, encircling the outermost of the first set of vias 403. The second protective ring 1104 has a width of between about 2 μm and about 10 μm, with a preferred width of about 5 μm.

After the first dielectric layer has been etched, the third mask is preferably removed and a fourth mask is formed over the metal layer 801, the second dielectric layer 601, the first dielectric layer 401, and portions of the substrate 301. The substrate 301 is then etched to remove exposed portions of the substrate 301. However, only an upper portion of the substrate 301 is removed, leaving a lower portion of the substrate 301 to remain. It should be noted that a third protective ring 1106 remains of the upper portion of the substrate 301, encircling the via 303.

The third protective ring 1106 preferably has a width of between about 5 μm and about 20 μm, with a preferred width of about 10 μm. The thickness of the remaining substrate 301 is between about 10 μm and about 100 μm, with a preferred thickness of about 60 μm. Finally, the fourth mask is removed to complete the formation of a single contact tip 1101.

As one of skill in the art will appreciate, the contact tip 1101 does not have to be made of exactly two dielectric layers with vias. A larger number of dielectric layers with consecutively smaller vias formed therein, could alternatively be used. Any number of dielectric layers, for example three or more dielectric layers, with vias formed therein could be used to form the contact tip 1101 and these dielectric layers are intended to be within the scope of the present invention.

Figure 12:
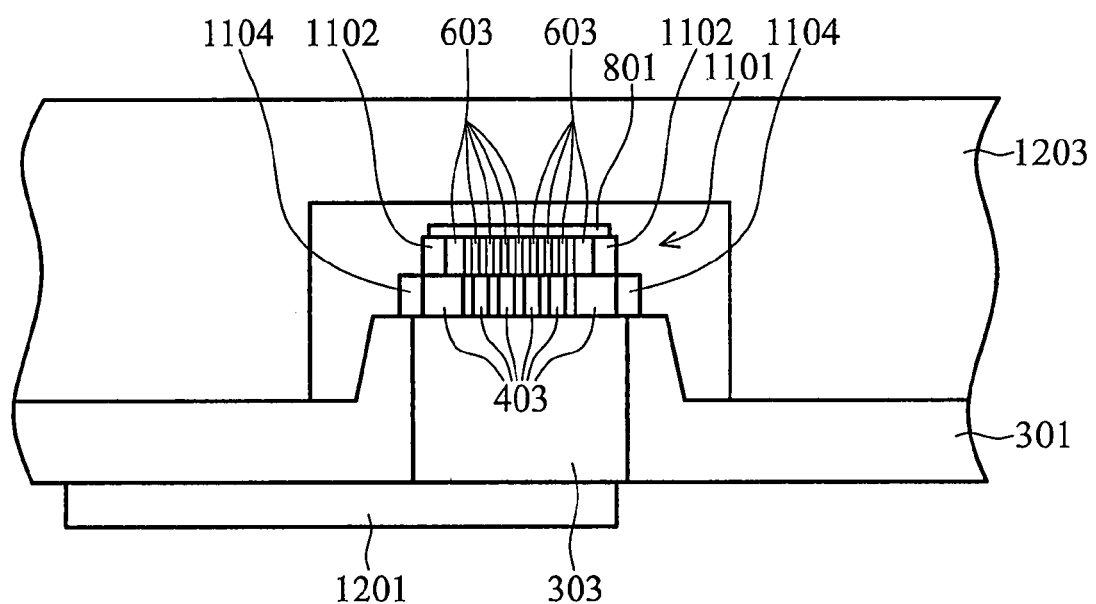

FIG. 12 illustrates that, once the contact tip 1101 has been formed, a third carrier wafer 1203 is connected to the substrate 301 in order to cover and protect the contact tip 1101. The third carrier wafer 1203 is preferably formed by etching a hole on a separate wafer, using an etchant such as potassium hydroxide. The third carrier wafer 1203 is then preferably bonded to the substrate 301 so that the contact tip 1101 fits within the etched hole, thereby protecting the contact tip 1101 from damage caused by further processing. With the contact tip 1101 protected, a redistribution line 1201 is formed in connection with the via 303 in order to help fan out the pitch of multiple contact tips 1101.

The redistribution line 1201 may be formed using common methods for forming interconnect lines in integrated circuits. Preferably, the redistribution line 1201 comprises at least two conductive layers formed of metals such as aluminum, copper, tungsten, titanium, and combinations thereof. The redistribution line 1201 is preferably formed by depositing the metal layers through chemical vapor deposition and then etching the undesired portions, leaving the redistribution line 1201. The redistribution line 1201 should be between about 2 μm and about 30 μm, with a preferred width of about 5 μm. However, other materials and process, such as a well-known damascene process, could alternatively be used to form the redistribution line 1201.

Figure 13:
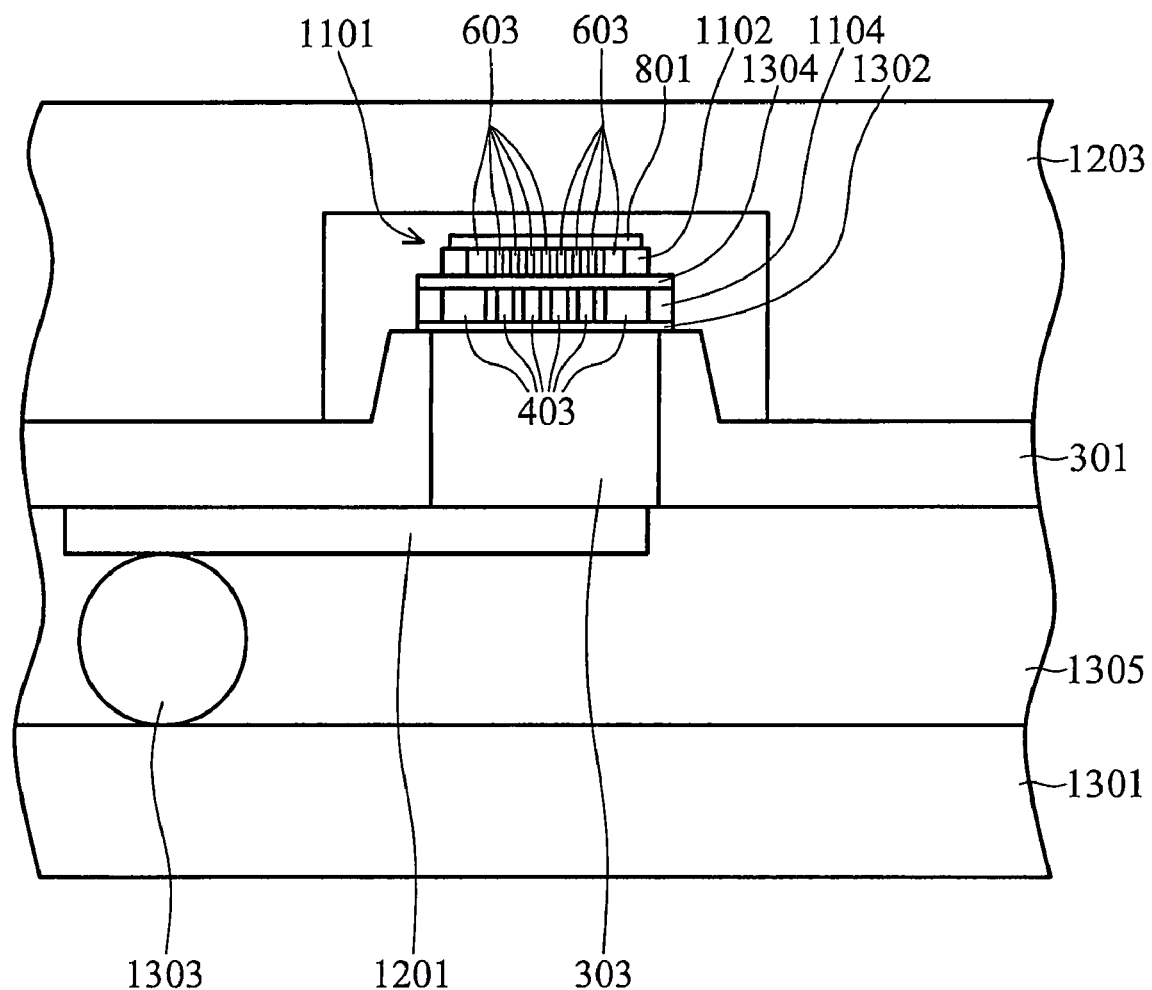

FIG. 13 illustrates the connection of a contact tip 1101 and redistribution line 1201 to a larger space transformation layer 1301. Specifically, the contact tip 1101 is connected to a space transformation layer 1301 through a solder bump 1303. Solder bump 1303 is formed on the space transformation layer 1301 and is placed so as to align with the redistribution line 1201 of the contact tip 1101. The solder bump 1303 preferably comprises either a high-lead, eutectic, lead free solder. When the contact tip 1101 and redistribution line 1201 is placed upon this solder bump 1303, electrical contact is established between the contact tip 1101 and conductors (not shown) located within the space transformation layer 1301.

An underfill material 1305 is injected or otherwise formed in the space between the contact tip 1101 and the space transformation layer 1301. The underfill material 1305 may, for example, comprise a liquid epoxy that is dispensed between the substrate 301 and the space transformation layer 1301, and then cured to harden. This underfill material is used to prevent cracks from being formed in the solder bump 1303, wherein cracks are typically caused by thermal stresses.

Alternatively, either a deformable gel or silicon rubber could be formed between the substrate 301 and the space transformation layer 1301 in order to help prevent cracks from occurring within the solder bump 1303. This gel or silicon rubber may be formed by injecting or otherwise placing the gel or rubber between the substrate 301 and the space transformation layer 1301. The deformable gel or silicon rubber can provide greater stress relief during testing of a semiconductor device.

The space transformation layer 1301 is preferably formed of a multiple layer ceramic, although a multiple layer organic could alternatively be used. This space transformation layer 1301 comprises alternating layers of conductive and insulative materials (not shown). The routing of the conductive material through the space transformation layer 1301 is designed to accept the small pitch of the solder bumps 1303 and expand the pitch to another set of contact pads on the opposite side of the space transformation layer 1301.

Figure 14:
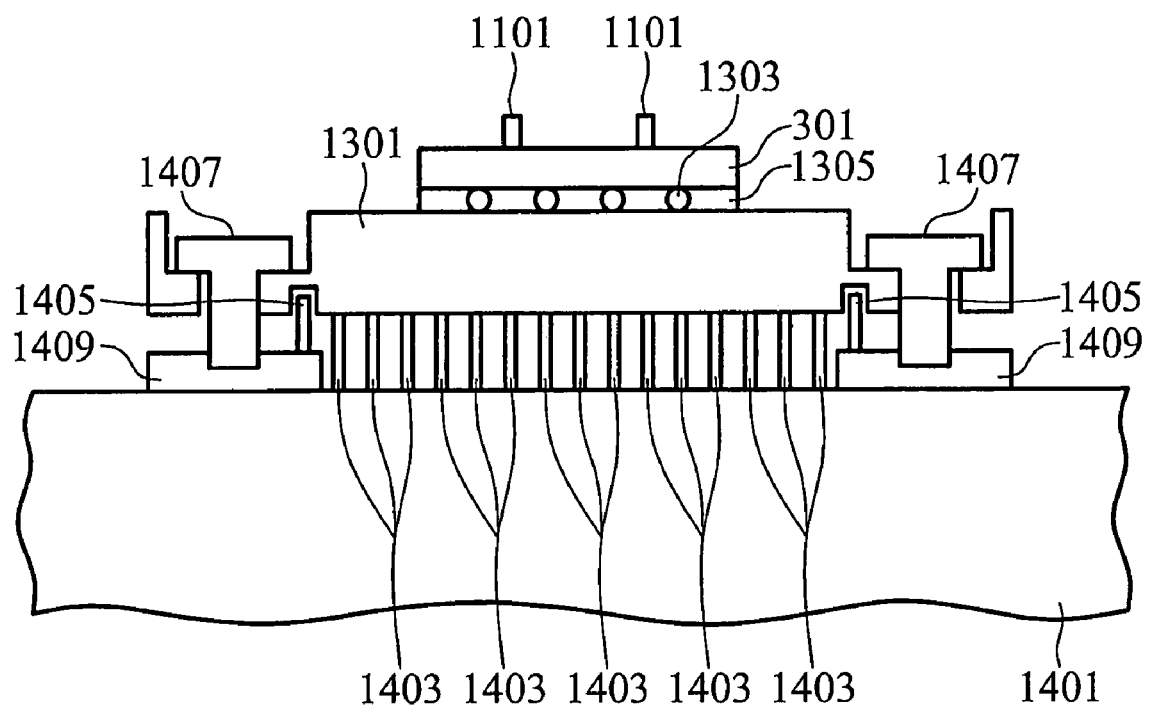
FIGS. 14 and 14A illustrate a side view and a top-down view, respectively, of a completed semiconductor device test structure in which pogo pins are used to connect the space transformation layer to the printed circuit board in accordance with an embodiment of the present invention.

FIG. 14 illustrates an embodiment of the present invention in which a plurality of contacts tips 1101, redistribution line 1201 and a space transformation layer 1301 are connected to a printed circuit board (PCB) 1401. Electrically, the space transformation layer 1301 is connected to the PCB 1401 through a series of connectors 1403. The connectors 1403 are spaced at the same pitch as the contact pads of the space transformation layer 1301 (on the opposite side from the solder bumps 1303). The connectors 1403, aside from providing the electrical connections required for the testing of semiconductor devices, also work to absorb the probing force from the rigid tips that are used, so that the semiconductor devices to be tested are not damaged during the placement of the structure. The connectors 1403 may also be used to further increase the pitch on the PCB 1401.

Preferably the connectors 1403 are pogo pins. These pogo pins provide contacts on each side of the pin and also include a spring so as to absorb some of the impact of contact. A preferred pogo pin includes a cylinder-type barrel, a contact tip at one end of the barrel, a spring connected to a plunger within the barrel, and a second contact tip connected to the plunger.

To ensure proper alignment between the connectors 1403 and the space transformation layer 1301 a system of slots located on the space transformation layer 1301 and guide pins 1405 located on the PCB 1401 is used. These guide pins 1405 fit into the slots formed into the space transformation layer 1301 and guide the space transformation layer 1301 when it is being connected to the PCB 1401 to ensure that the electrical connections on the space transformation layer 1301 connect to the connectors 1403.

As one with ordinary skill in the art will recognize, the space transformation layer 1301 may be aligned with the printed circuit board 1401 in many different ways, and the guide pins 1405 as described above are not meant to limit the present invention. Alternatively, the present invention is also intended to include other smooth fixtures that can be made with high precision, such as cylindrical structures, that can be used to limit the movement of the space transformation layer 1301 to the direction that is perpendicular to a major surface of the printed circuit board 1401.

Additionally, a system of screws 1407 are preferably used to fine-tune the plurality of the contact tips 1101. Because the tips have such a small pitch, the planarity of the tips becomes very important, since even a small irregularity in the planarity could cause some tips to fail to connect to a required device. Accordingly, the space transformation layer 1301 is also connected to the PCB 1401 through a system of screws 1407. In an embodiment, three screws 1407 extend through the space transformation layer 1301 and fit into bottom mounting fixtures 1409 connected to the PCB 1401. By adjusting these screws 1407, the planarity of the space transformation layer 1301, the substrate 301, and the contact tips 1101 can be adjusted.

Figure 14A:
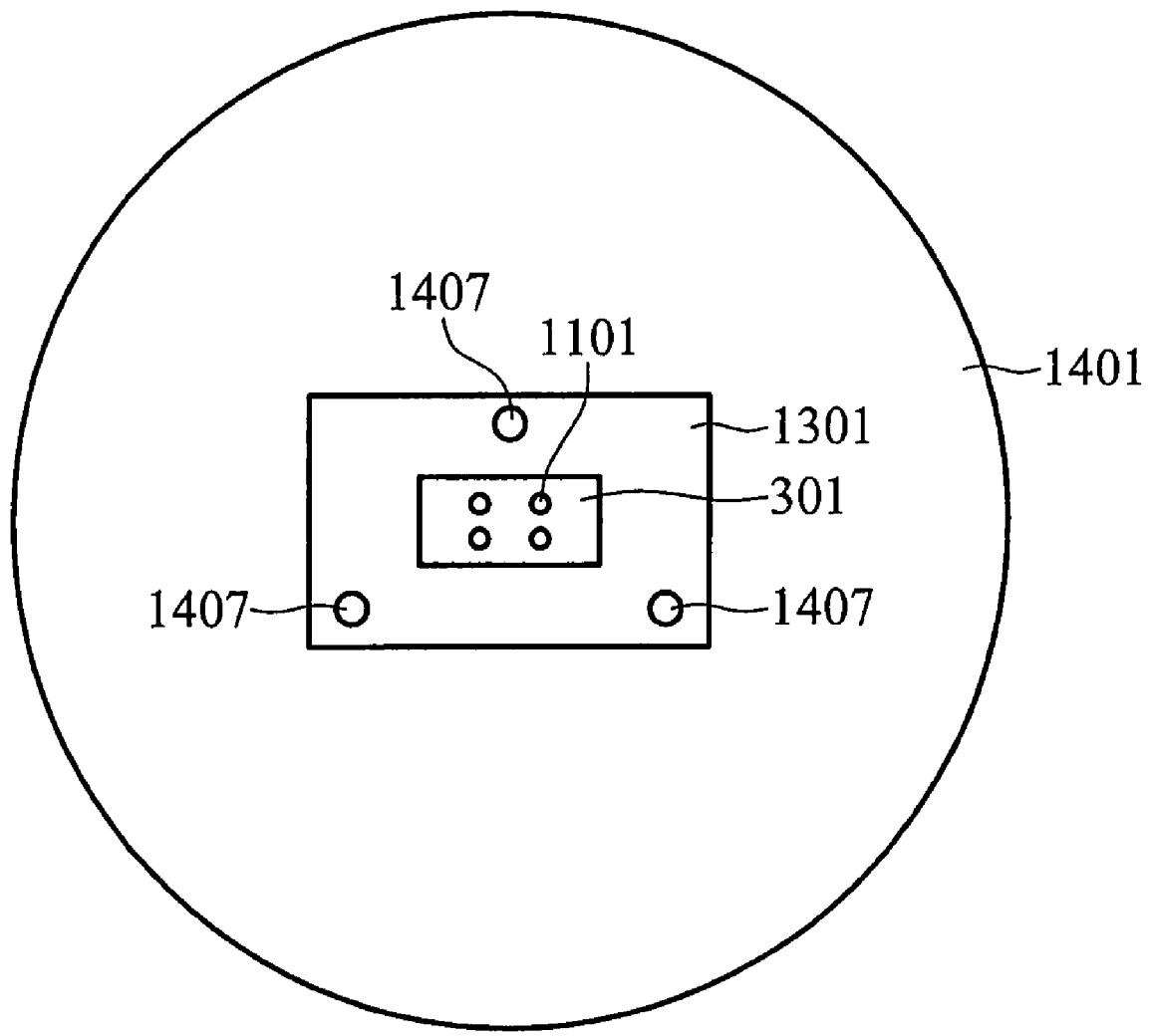

FIG. 14A shows a top down view of the embodiment described above with reference to FIG. 14. This view more clearly illustrates that the system of three screws 1407 may be utilized to adjust the co-planarity of the space transformation layer 1301, the substrate 301, and, ultimately, the contact tips 1101. However, more or less screws 1407 could be alternatively used.

Figure 15:
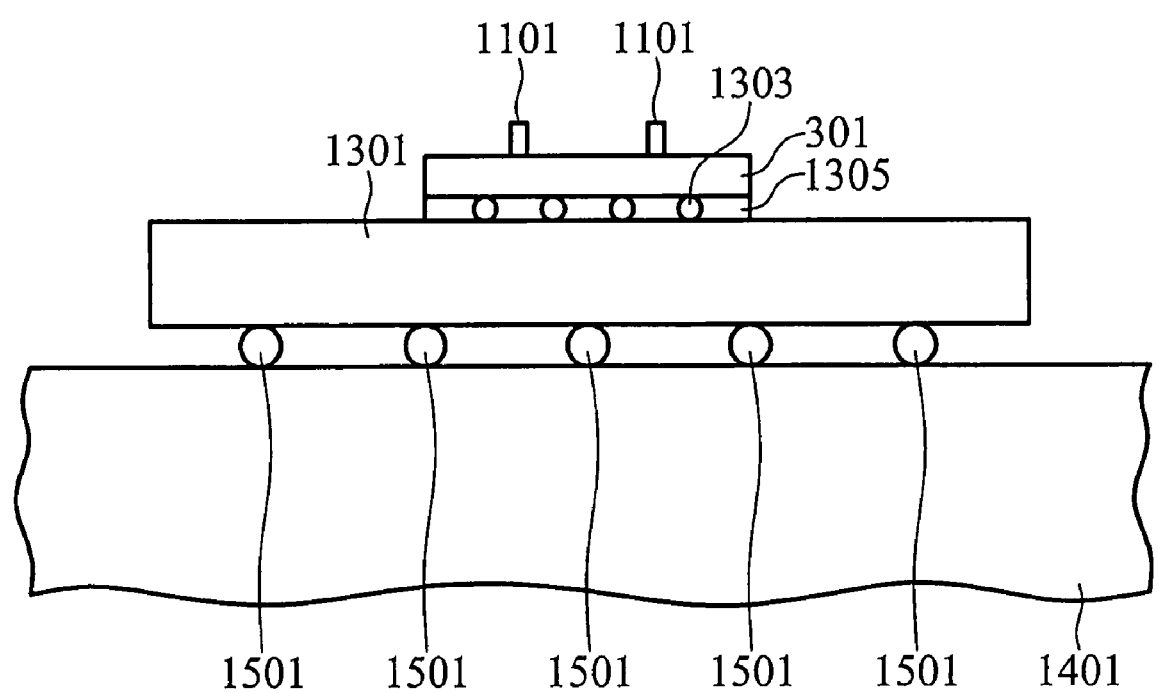
FIG. 15 illustrates a completed semiconductor device test structure in which solder balls are used to connect the space transformation layer to the printed circuit board in accordance with an embodiment of the present invention.

FIG. 15 illustrates another embodiment of the present invention in which the connectors 1403 that connect the space transformation layer 1301 and the PCB 1401, instead of comprising pogo pins as described above, alternatively comprise solder balls 1501. The solder balls 1501 are preferably formed of high-lead, eutectic, or lead-free solder, and are formed so as to create an electrical connection between the space transformation layer 1301 and the PCB 1401.

As one of ordinary skill in the art will realize, the pogo pin embodiment and the solder ball embodiment of the connectors 1403 as described above are meant to be merely illustrative of the many embodiments that the connectors 1403 could take. These disclosed embodiments, however, are not meant to limit the present invention, and alternative embodiments of the connectors 1403 are also fully intended to be within the scope of the present invention.

Figure 16:
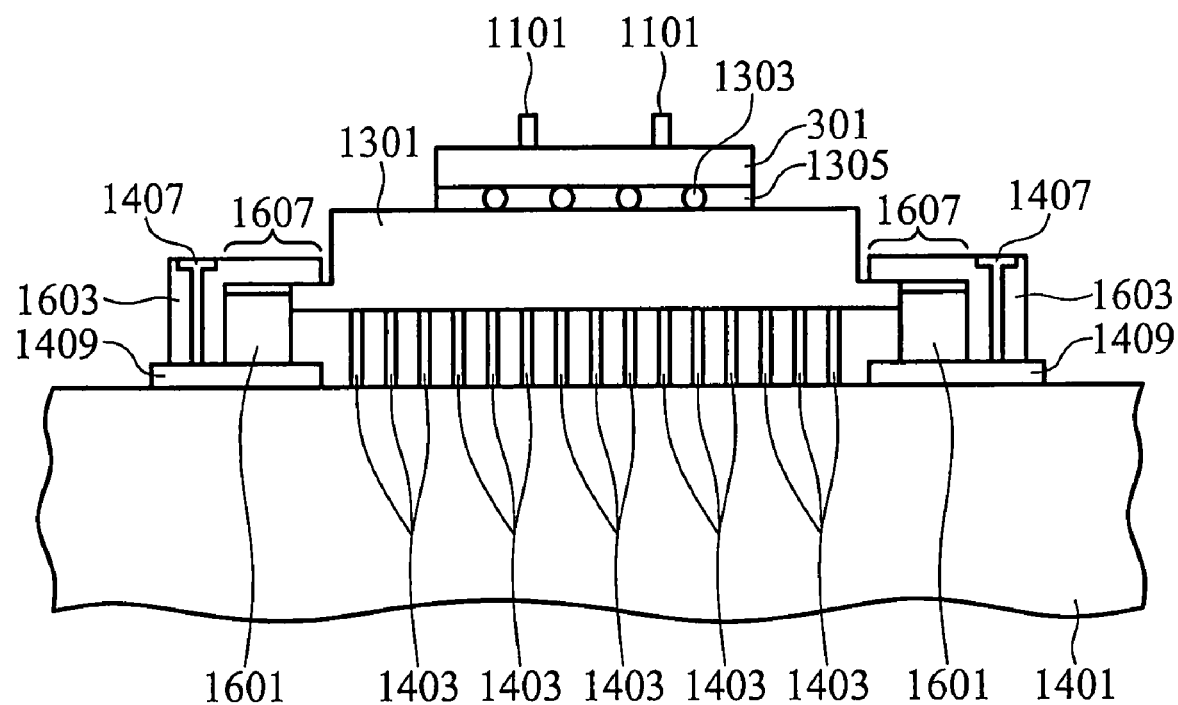
FIGS. 16 and 16A illustrate a side view and a top-down view, respectively, of a completed semiconductor device test structure in which smooth fixtures are used to align the space transformation layer and the printed circuit board, and screws attached to a top mounting fixture are used to align the contact tips.

FIG. 16 illustrates yet another embodiment, in which the guide pins 1405 (see FIG. 14) that are used to align the connectors 1403 are replaced with a high precision smooth fixture 1601. In this embodiment, the system of screws 1407 (see FIG. 14) do not run through the space transformation layer 1301 and into a bottom mounting fixture 1409. Instead, a top mounting fixture 1603 is placed over the bottom mounting fixture 1409, and the screws 1407 are run through the top mounting fixture 1603 and into the bottom mounting fixture 1409.

The top mounting fixture 1603 has an extension 1607 that extends away from the screws 1407 and over at least a portion of the space transformation layer 1301. By extending over a portion of the space transformation layer 1301, the top mounting fixture 1603, in conjunction with the screws 1407, may be used to adjust the planarity of the space transformation layer 1301 and the contact tips 1101.

The smooth fixture 1601 is used to ensure that the space transformation layer 1301 can only move perpendicular to the major surface of the PCB 1401. One such fixture that may be used, for example, is a cylinder with very precise dimensions. In an embodiment, this cylinder would be connected to the bottom mounting fixture 1409 and would be located under the extension of the top mounting fixture 1603 and between the space transformation layer 1301 and the remaining portion of the top mounting fixture 1603. The cylinder would allow for the space transformation layer 1301 to move perpendicular to the major surface of the PCB 1401 to allow the pogo pins to deform and absorb the forces during contact with a test wafer (not shown), but would not allow the space transformation layer 1301 (and the contact tips 1101) to move side-to-side and out of alignment.

Figure 16A:
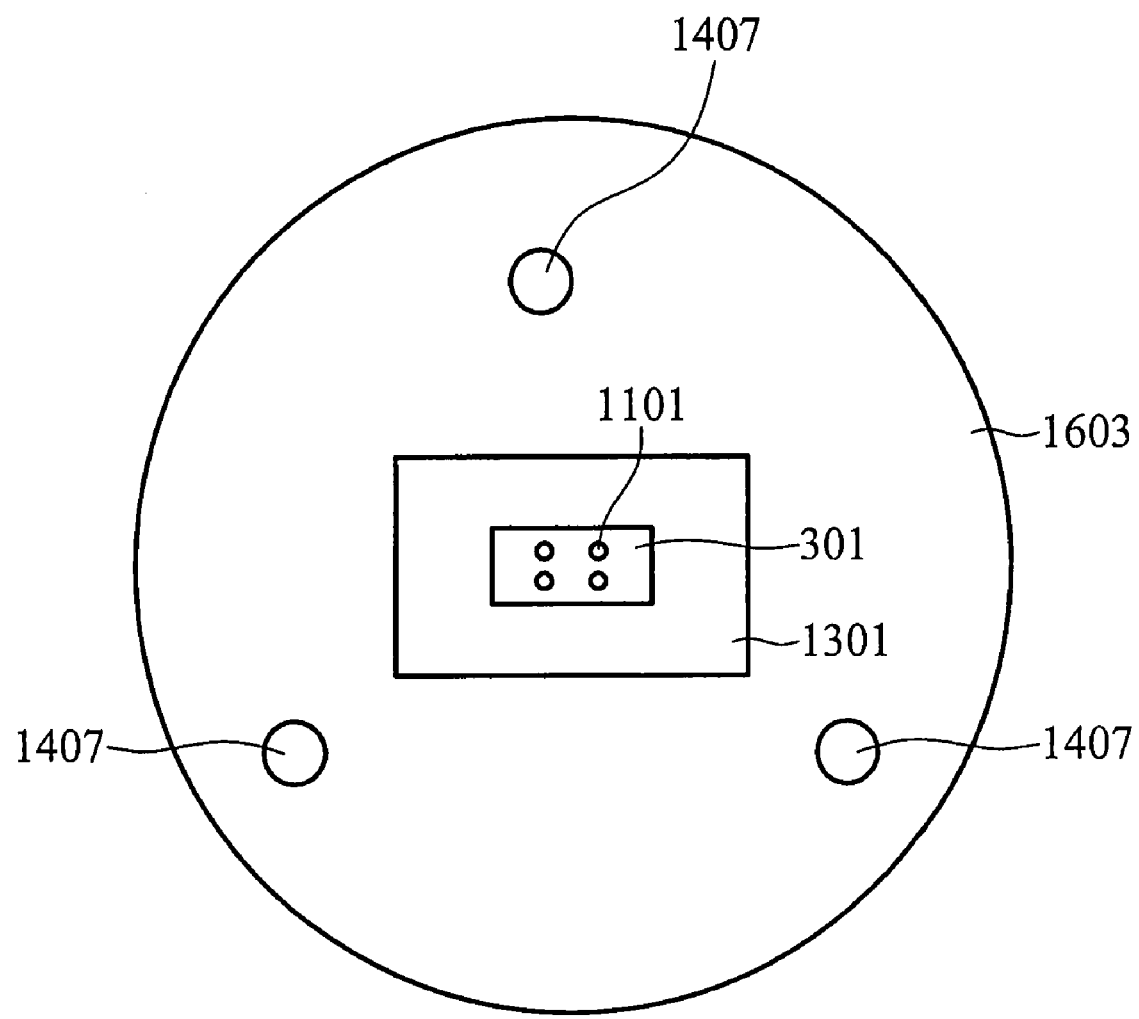

FIG. 16A illustrates a top-down view of the embodiment described above with reference to FIG. 16. This view more clearly illustrates that the system of screws 1407 in this embodiment are connected to the top mounting fixture 1603 and may be utilized to adjust the planarity of the space transformation layer 1301, the substrate 301, and, ultimately, the contact tips 1101. In this embodiment three screws 1407 are used to adjust the planarity of the contact tips 1101. However, more or less screws 1407 could be alternatively used.

Using this invention, the pitch of the contact tips can be greatly reduced. In testing, the test probing pitch can actually be reduced to less than about 50 µm, which is way beyond the 175 µm pitch used by other methods. Accordingly, semiconductor devices with reduced size can be tested with embodiments of the present invention than would otherwise be able.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device test structure, the semiconductor device test structure comprising:
   a printed circuit board;
   a space transformation layer having a first major surface and a second major surface, the first major surface being on an opposing surface from the second major surface, the first major surface having a first set of contacts facing the printed circuit board, the second major surface having a second set of contacts with a first pitch;
   compressible connectors electrically coupling electrical contacts on the printed circuit board to the first set of contacts on the space transformation layer, the space transformation layer being movable relative to the printed circuit board while maintaining an electrical connection between the electrical contacts on the printed circuit board and the first set of contacts on the space transformation layer via the compressible connectors; and
   a substrate located over the space transformation layer, a plurality of contact tips with a second pitch smaller than the first pitch, the plurality of contact tips located on the substrate, wherein each contact tip is electrically coupled to respective ones of the second set of contacts.

2. The semiconductor device test structure of claim 1, further comprising a plurality of adjusters coupling the space transformation layer to the printed circuit board, the plurality of adjusters being configured to adjust the planarity of the space transformation layer relative to the printed circuit board.

3. The semiconductor device test structure of claim 1, further comprises guides to position the space transformation layer relative to the printed circuit board, the guides further limiting movement of the space transformation layer relative to the printed circuit board to a direction substantially normal to a major surface of the printed circuit board.

4. The semiconductor device test structure of claim 1, further comprises conductive vias through the substrate, wherein conductive vias electrically coupling respective ones of the contact tips to respective ones of the second set of contacts of the space transformation layer.

5. The semiconductor device test structure of claim 4, wherein each of the plurality of contact tips comprises:
   a first dielectric layer located over at least one of the conductive vias, the first dielectric layer having a first set of vias formed therein, one or more of the first set of vias being in electrical contact with at least one of the conductive vias; and
   a first metal layer over the first set of vias.

6. The semiconductor device test structure of claim 1, wherein the compressible connectors comprise pogo pins.

7. The semiconductor device test structure of claim 1, wherein a first pitch of the electrical contacts on the printed circuit board is greater than a second pitch of the plurality of contact tips.

8. The semiconductor device test structure of claim 1, further comprising:
   slots formed within the space transformation layer; and
   guidance pins connected to the printed circuit board and designed to fit within the slots.

9. A semiconductor device test structure, the semiconductor device test structure comprising:
   a printed circuit board with a first set of contact pads;
   a space transformation layer over the printed circuit board, the space transformation layer comprising:
      a second set of contact pads on a first surface of the space transformation layer facing the printed circuit board;
      a third set of contact pads on a second surface of the space transformation layer opposite the printed circuit board, the third set of contact pads having a first pitch; and
      conductive lines electrically connecting the second set of contact pads and the third set of contact pads;
   a first plurality of connectors between the first set of contact pads and the second set of contact pads;
   a substrate located over the space transformation layer; and
   a plurality of tips located on the substrate, the plurality of tips having a second pitch that is smaller than the first pitch, and wherein each tip is electrically connected to respective ones of the third set of contact pads.

10. The semiconductor device test structure of claim 9, wherein the first plurality of connectors comprises pogo pins or solder balls.

11. The semiconductor device test structure of claim 9, further comprising an underfill material between the space transformation layer and the substrate, the underfill material comprising either an epoxy material, silicon rubber or a deformable gel material.

12. The semiconductor device test structure of claim 9, wherein the first plurality of connectors has a third pitch that is larger than the second pitch.

13. The semiconductor device test structure of claim 9, further comprising conductive vias located within the substrate and electrically coupling respective ones of the plurality of tips to respective ones of the second set of contact pads.

14. The semiconductor device test structure of claim 9, wherein each of the plurality of tips further comprises:
   a first dielectric layer located over the substrate, the first dielectric layer having a first set of vias formed therein, one or more of the first set of vias being in electrical contact with the third set of contact pads; and
   a first metal layer over the first set of vias.

15. A semiconductor device test structure, the semiconductor device test structure comprising:
   a plurality of tips having a first pitch, each tip comprising:
      a substrate with an upper region and a lower region;
      a first via extending through the upper region and lower region of the substrate;
      a first dielectric layer over the first via;
      a first set of vias located within the first dielectric layer, one or more of the first set of vias being in electrical contact with the first via; and
      a first metal layer located over the first set of vias, the first metal layer being in electrical contact with one or more of the first set of vias; and
   a first plurality of electrical connectors connected to respective ones of the first set of vias, the first plurality of electrical connectors having a second pitch larger than the first pitch.

16. The semiconductor device test structure of claim 15, wherein the plurality of tips further comprises a second metal layer between the substrate and the first dielectric layer.

17. The semiconductor device test structure of claim 15, wherein the plurality of tips further comprises:

a second dielectric layer between the first dielectric layer and the substrate; and a third metal layer between the first dielectric layer and the second dielectric layer.

18. The semiconductor device test structure of claim 15, further comprising:
a space transformation layer with a first set of contact pads on a first side of the space transformation layer, the first set of contact pads connected to the respective ones of the first plurality of electrical connectors, and a second set of contact pads located on an opposite side of the space transformation layer than the first set of contact pads, the second set of contact pads having a larger pitch than the first set of contact pads;
a printed circuit board having a third set of contact pads; and
a second plurality of electrical connectors between the third set of contact pads and the space transformation layer, the second plurality of electrical connectors electrically connecting the third set of contact pads to respective ones of the second set of contact pads.

19. The semiconductor device test structure of claim 18, further comprising an underfill material between the space transformation layer and the substrate, the underfill material comprising either an epoxy material, silicon rubber or a deformable gel material.

20. The semiconductor device test structure of claim 15, wherein the plurality of tips further comprises:
a second dielectric layer under the first set of vias; and
a second set of vias located within the second dielectric layer, one or more of the second set of vias being in electrical contact with one or more of the first set of vias.

21. The semiconductor device test structure of claim 15, further comprising a plurality of redistribution lines electrically connecting the first vias to respective ones of the first plurality of electrical connectors.

22. A semiconductor device test structure, the semiconductor device test structure comprising:
a printed circuit board with a first plurality of contact pads;
a space transformation layer over the circuit board, wherein the space transformation layer has a second plurality of contact pads on a first major surface of the space transformation layer facing the printed circuit board, and a third plurality of contact pads on a second major surface of the space transformation layer facing away from the printed circuit board, each contact pad of the third plurality of contact pads being electrically connected to one of the contact pads of the second plurality of contact pads, wherein the second plurality of contact pads having a first pitch and the third plurality of contact pads having a second pitch that is smaller than the first pitch;
a first plurality of electrical connections connecting the first plurality of contact pads and the second plurality of contact pads;
a substrate over the space transformation layer, the substrate having a plurality of conductive vias formed therein, wherein the plurality of conductive vias is electrically connected to the third plurality of contact pads;
a plurality of tips located on the substrate, each tip connected to respective ones of the conductive vias, the plurality of tips having a third pitch that is smaller than the second pitch, each tip comprising:
a plurality of dielectric layers, each dielectric layer having a set of vias formed therein, the vias of one dielectric layer being in electrical contact with the vias of adjacent dielectric layers, the plurality of dielectric layers including an outermost dielectric layer located furthest from the substrate; and
a metal layer over the outermost dielectric layer of the plurality of dielectric layers, the metal layer being in electrical contact with the vias formed within the outermost dielectric layer.

23. The semiconductor device test structure of claim 22, wherein the first plurality of electrical connections comprise either pogo pins or solder balls.

24. The semiconductor device test structure of claim 22, further comprising:
a plurality of redistribution lines located between the substrate and the space transformation layer, the plurality of redistribution lines being electrically connected to respective ones of the plurality of conductive vias; and
a second plurality of electrical connections connecting the plurality of redistribution lines to the third plurality of contact pads.

25. The semiconductor device test structure of claim 22, further comprising:
bottom mounting structures connected to the printed circuit board and surrounding the first plurality of electrical connections;
smooth fixtures connected to the bottom mounting structures and located next to the space transformation layer, the smooth fixtures located so as to restrict the movement of the space transformation layer to one direction;
top mounting structures located over the bottom mounting structures, a portion of the top mounting structure extending over at least a portion of the space transformation layer; and
adjustable screws connecting the top and bottom mounting fixtures.

26. The semiconductor device test structure of claim 22, further comprising:
bottom mounting structures connected to the printed circuit board and surrounding the first plurality of electrical connections; and
a plurality of adjustable screws connecting the space transformation layer to the printed circuit board.

27. The semiconductor device test structure of claim 22, further comprising a guidance mechanism arranged so as to ensure the proper alignment of the first plurality of electrical connections.

28. The semiconductor device test structure of claim 27, wherein the guidance mechanism comprises:
slots formed within the space transformation layer; and
guidance pins connected to the printed circuit board and designed to fit within the slots.

* * * * *